(12) United States Patent
Matsumoto et al.

(10) Patent No.: US 10,310,525 B2
(45) Date of Patent: Jun. 4, 2019

(54) ELECTRONIC DEVICE THAT MEASURES A STANDBY CURRENT OF A CIRCUIT AFTER BURN-IN

(71) Applicant: Hitachi Automotive Systems, Ltd., Hitachinaka-shi, Ibaraki (JP)

(72) Inventors: Masahiro Matsumoto, Tokyo (JP); Hiroshi Nakano, Tokyo (JP); Yoshimitsu Yanagawa, Tokyo (JP); Akira Kotabe, Hitachinaka (JP)

(73) Assignee: Hitachi Automotive Systems, Ltd., Hitachinaka-shi (JP)

(*) Notice: Subject to any disclaimer, the term of this patent is extended or adjusted under 35 U.S.C. 154(b) by 0 days.

(21) Appl. No.: 15/538,780

(22) PCT Filed: Nov. 27, 2015

(86) PCT No.: PCT/JP2015/083309
§ 371 (c)(1),
(2) Date: Jun. 22, 2017

(87) PCT Pub. No.: WO2016/104041
PCT Pub. Date: Jun. 30, 2016

(65) Prior Publication Data
US 2017/0344040 A1 Nov. 30, 2017

(30) Foreign Application Priority Data
Dec. 26, 2014 (JP) .................................. 2014-263806

(51) Int. Cl.
*G05F 1/56* (2006.01)
*G01R 19/00* (2006.01)
(Continued)

(52) U.S. Cl.
CPC ........... *G05F 1/56* (2013.01); *G01R 19/0069* (2013.01); *G05F 1/465* (2013.01); *G05F 1/565* (2013.01);
(Continued)

(58) Field of Classification Search
CPC ............ G05F 1/455; G05F 1/465; G05F 1/56; G01R 19/0069; H02M 3/156–3/158;
(Continued)

(56) References Cited

U.S. PATENT DOCUMENTS 3,237,082 A * 2/1966 Felcheck ................. H01L 21/00
327/535
4,710,699 A * 12/1987 Miyamoto ......... H03K 17/0824
323/246
(Continued)

FOREIGN PATENT DOCUMENTS

EP  2 264 561 A1  12/2010
JP  10-9041 A  1/1998
(Continued)

OTHER PUBLICATIONS

International Search Report (PCT/ISA/210) issued in PCT Application No. PCT/JP2015/083309 dated Mar. 22, 2016 with English translation (three (3) pages).
(Continued)

*Primary Examiner* — Yemane Mehari
(74) *Attorney, Agent, or Firm* — Crowell & Moring LLP

(57) ABSTRACT

Provided is an electronic device which can easily measure a standby current of an internal circuit of an electronic device after burn-in. The electronic device includes: a power source terminal; a regulator that generates a predetermined voltage from a voltage of the power source terminal; an internal circuit that is operated by an output voltage of the regulator;
(Continued)

and a standby terminal through which the regulator and the internal circuit are set to a low power consumption state.

20 Claims, 4 Drawing Sheets

(51) Int. Cl.
*G05F 1/46* (2006.01)
*G05F 1/565* (2006.01)
*B23K 11/24* (2006.01)
*H02M 3/158* (2006.01)
*B03C 3/68* (2006.01)
*H02M 5/257* (2006.01)
*H02M 3/156* (2006.01)

(52) U.S. Cl.
CPC .............. *B03C 3/68* (2013.01); *B23K 11/248* (2013.01); *H02M 3/156* (2013.01); *H02M 3/1588* (2013.01); *H02M 5/2573* (2013.01)

(58) Field of Classification Search
CPC ............ H02M 3/1584; H02M 3/1588; H02M 5/2573; B03C 3/68; B23K 11/248
USPC ......................................... 323/324, 246, 282
See application file for complete search history.

(56) References Cited

U.S. PATENT DOCUMENTS

| | | | | |
|---|---|---|---|---|
| 5,477,279 A * | 12/1995 | Chang | .................. | G11B 31/006 348/730 |
| 5,999,007 A * | 12/1999 | Kimura | .................. | G01R 31/14 324/750.05 |
| 6,225,709 B1 * | 5/2001 | Nakajima | ................ | H04N 5/63 307/116 |
| 7,759,911 B2 * | 7/2010 | Omi | .................... | H02M 3/1588 323/222 |
| 7,782,041 B1 * | 8/2010 | Li | ........................... | G05F 1/575 323/280 |
| 8,598,800 B2 * | 12/2013 | Uchimoto | ............... | H02M 1/36 315/209 R |
| 2008/0169706 A1 | 7/2008 | Onishi et al. | | |
| 2014/0247523 A1 * | 9/2014 | Kawano | ................... | H02H 9/02 361/18 |
| 2017/0063232 A1 * | 3/2017 | Takano | ..................... | G05F 1/56 |

FOREIGN PATENT DOCUMENTS

JP 10-63355 A 3/1998
JP 2004-320890 A 11/2004

OTHER PUBLICATIONS

Japanese-language Written Opinion (PCT/ISA/237) issued in PCT Application No. PCT/JP2015/083309 dated Mar. 22, 2016 (four (4) pages).
The partial supplementary European Search Report issued in counterpart European Application No. 15872610.9 dated Sep. 21, 2018 (13 pages).

* cited by examiner

ELECTRONIC DEVICE THAT MEASURES A STANDBY CURRENT OF A CIRCUIT AFTER BURN-IN

TECHNICAL FIELD

The present invention relates to an electronic device equipped with an internal circuit operated by an output voltage of a regulator which generates a predetermined voltage from a voltage of a power source terminal, and particularly to an electronic device which easily measures a standby current of the internal circuit.

BACKGROUND ART

As an exemplary electronic device of the related art, PTL 1 discloses an on-vehicle electronic unit.

CITATION LIST

Patent Literature

PTL 1: JP 10-9041 A

SUMMARY OF INVENTION

Technical Problem

The technique disclosed in PTL 1 takes burn-in into consideration, but fails in taking account of measuring a standby current after burn-in.

FIG. 4 illustrates a configuration of a regulator of the electronic device of the related art. A regulator circuit 104 of the electronic device in the related art is configured by a battery power line 106, a voltage monitoring circuit 500 which monitors a voltage of the battery power line 106, a bandgap reference 512 which generates a reference voltage, a constant voltage generating transistor 503 which controls an output voltage of the regulator circuit 104, a division ratio switching circuit 502 which switches a division ratio according to a signal of the voltage monitoring circuit 500 to divide the output voltage of the regulator circuit 104, an amplifier circuit 501 which controls the constant voltage generating transistor 503 on the basis of a voltage difference between the bandgap reference 512 and an output of the division ratio switching circuit 502, and a regulator output line 105 which connects the output voltage of the regulator circuit 104 to an internal circuit (LSI required to be burn-in). The voltage monitoring circuit 500 is configured by a comparator 511 and resistors R1 and R2, and the division ratio switching circuit 502 is configured by resistors R3, R4, and R5 and a MOS transistor 510.

In this electronic device, the output voltage of the regulator circuit 104 is changed by the division ratio switching circuit 502 to apply a burn-in voltage to the internal circuit. However, a failure determination of the internal circuit after burn-in is performed only by confirming the operation. A failure of the LSI caused by burn-in starts from an increase in leak current of an oxide film of a MOS transistor of the LSI, and then it is developed to a malfunction. Therefore, the increase in leak current which is an initial stage of failure is not possible to be detected only by confirming the operation. Since the LSI increased in the leak current causes an operational failure earlier compared to the LSI having a small leak current, there is a need to detect the increase in leak current after burn-in in order to secure a life span of a product for sure. In general, the LSI has a standby terminal in order to detect the increase in leak current. A consumption current of the LSI can be made almost zero by activate the standby terminal. At this time, the consumption current is called a standby current which depends on the leak current in the LSI. In other words, when the standby terminal is activated, the increase of the leak current in the LSI caused by burn-in can be detected by measuring the standby current. However, the internal circuit (LSI required to be burn-in) in this electronic device has no function of measuring the standby current. Therefore, it is hard to secure the life span of the product for sure.

An object of the invention is to provide an electronic device which can easily measure the standby current of the internal circuit of the electronic device after burn-in.

Solution to Problem

In order to solve the above issue, an electronic device according to the present invention includes: a power source terminal; a regulator that generates a predetermined voltage from a voltage of the power source terminal; an internal circuit that is operated by an output voltage of the regulator; and a standby terminal through which the regulator and the internal circuit are set to a low power consumption state.

Advantageous Effects of Invention

According to the invention, it is possible to provide an electronic device which can easily measure a standby current after burn-in of an internal circuit which is operated by an output voltage of a regulator.

DESCRIPTION OF EMBODIMENTS

Hereinafter, embodiments of the invention will be described with reference to the drawings.

First Embodiment

Figure 1:
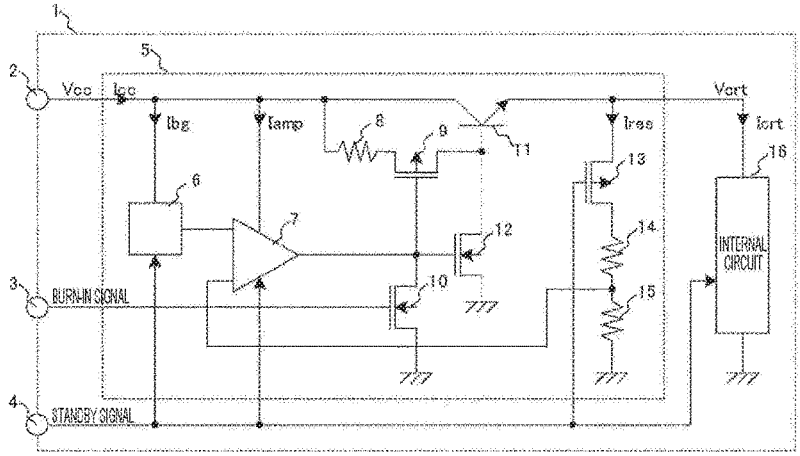
FIG. 1 is a diagram illustrating a configuration of an electronic device of a first embodiment.
Figure 2:
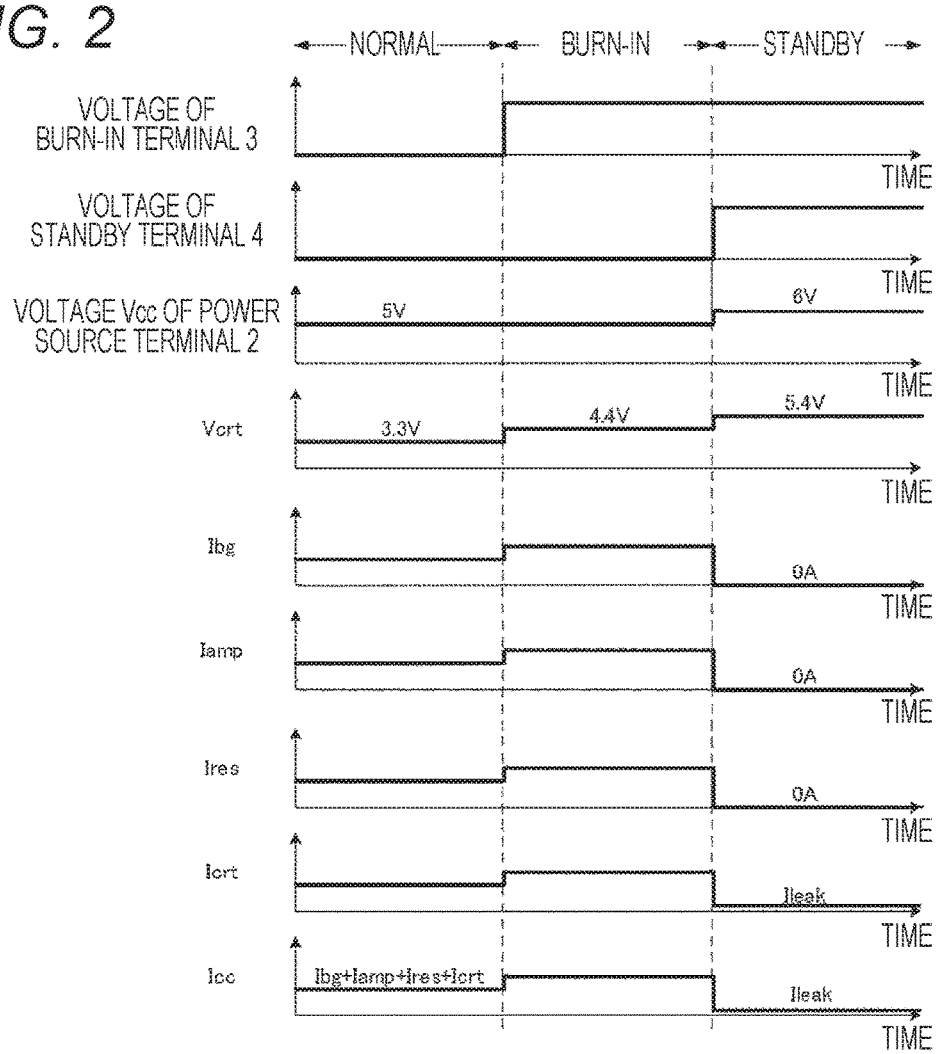
FIG. 2 is an operation chart of the electronic device of the first embodiment.
Figure 3:
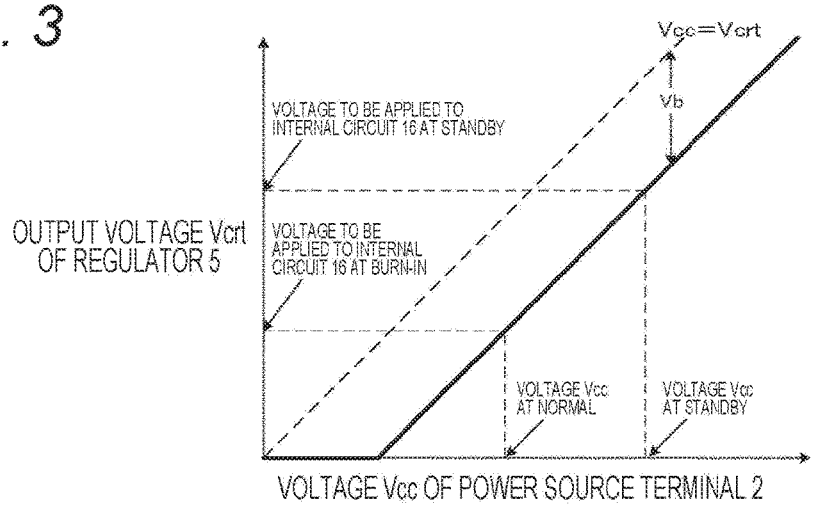
FIG. 3 is a graph illustrating a relation between a voltage of a power source terminal 2 and an output voltage of a regulator 5.
Figure 4:
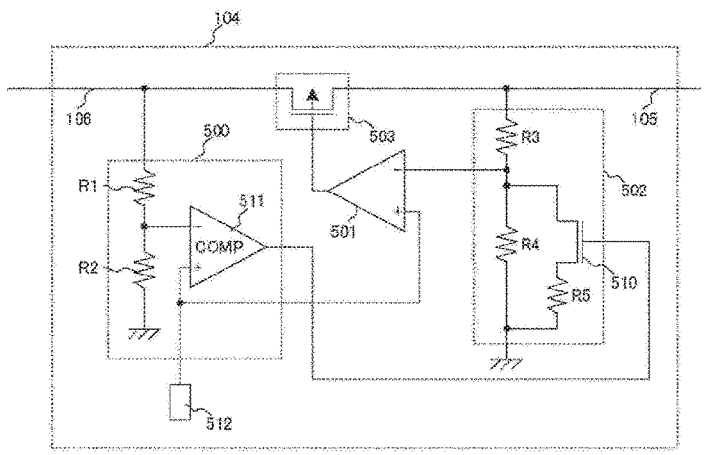
FIG. 4 is a diagram illustrating a configuration of the regulator of an electronic device of the related art.

First, an electronic device of a first embodiment of the invention will be described using FIGS. 1, 2, and 3. Further, FIG. 1 is a diagram illustrating a configuration of the electronic device of the first embodiment, FIG. 2 is an operation chart of the electronic device of the first embodiment, and FIG. 3 is a graph illustrating a relation between a voltage of a power source terminal 2 and an output voltage of a regulator 5.

An electronic device 1 of this embodiment is configured by the power source terminal 2 which supplies power, a burn-in terminal 3 which applies a burn-in signal, a standby terminal 4 which applies a standby signal, the regulator 5 which generates a predetermined voltage from the voltage of the power source terminal 2, and an internal circuit 16 which is operated by an output voltage of the regulator 5. The regulator 5 is configured by a reference voltage source 6 which generates a reference voltage, fixed resistors 14 and 15 which divide an output voltage Vcrt of the regulator 5, a MOS transistor 13 which blocks a current flowing to the fixed resistors 14 and 15 according to the standby signal, an amplifier 7 which amplifies a voltage difference between a voltage divided by the resistors 14 and 15 and an output voltage of the reference voltage source 6, MOS transistors 9 and 12 which are driven by the output of the amplifier 7, a transistor 11 of which a base current is controlled by the MOS transistors 9 and 12, a fixed resistor 8 which limits a base current of the transistor 11, and a MOS transistor 10 which sets the MOS transistor 9 to an ON state and the MOS transistor 12 to an OFF state according to the burn-in signal.

Next, an operation of the electronic device 1 of this embodiment will be described using FIG. 2. At a normal time, the voltage (burn-in signal) of the burn-in terminal 3 is at a low level, and the voltage (standby signal) of the standby terminal 4 is also at the low level. At this time, a voltage Vcc of the power source terminal 2 is supplied with 5 V as a power source voltage at a normal time. Therefore, since the regulator 5 is also operated normally, the output voltage Vcrt of the regulator 5 becomes 3.3 V, and the internal circuit 16 is also operated normally by the output voltage Vcrt. At this time, a consumption current Icc of the power source terminal 2 becomes a sum of a consumption current Ibg of the reference voltage source 6, a consumption current Iamp of the amplifier 7, a current Ires flowing to the fixed resistors 14 and 15, and a consumption current Icrt of the internal circuit 16.

Next, the operation at the time of burn-in will be described. At the time of burn-in, the voltage (burn-in signal) of the burn-in terminal 3 is set to a high level, and the voltage (standby signal) of the standby terminal 4 is set to the low level. At this time, the voltage Vcc of the power source terminal 2 is supplied with 5 V as a power source voltage at a normal time. At this time, since the MOS transistor 10 enters the ON state by the burn-in signal, the MOS transistor 9 moves to the ON state, and the MOS transistor 12 moves to the OFF state. As a result, the base and the collector of the transistor 11 are connected by the fixed resistor 8, the output voltage of the regulator 5 becomes 4.4 V dropped by a voltage (about 0.6 V) corresponding to one diode voltage from Vcc. Therefore, 4.4 V is supplied to the internal circuit 16.

FIG. 3 is a graph illustrating a relation between the voltage Vcc of the power source terminal 2 and the output voltage Vcrt of the regulator 5 at the time of burn-in. However, at the time of burn-in, a voltage drop (about 0.6 V) corresponding to one diode voltage from the voltage Vcc of the power source terminal 2 is caused in the output voltage Vcrt of the regulator 5. Therefore, only by applying the high level to the burn-in terminal 3, 4.4 V to be applied at the time of burn-in can be applied to the internal circuit 16 while applying the voltage at a normal time in the power source terminal 2. In other words, since there is no need to prepare a specific power source for burn-in, a facility for performing the burn-in can be simplified. This can be achieved by dropping the voltage by the regulator circuit 5 only by a voltage difference between the power source voltage Vcc at a normal time and the voltage applied to the internal circuit 16 at the time of burn-in. In addition, in a case where a burn-in voltage is changed later, the output voltage of the regulator 5 can be operated by slightly adjusting the power source voltage Vcc. In other words, a burn-in device can be simplified, and it is possible to cope with the burn-in voltage change by setting the output voltage Vcrt of the regulator 5 to be a constant voltage with respect to the voltage Vcc of the power source terminal 2. Further, it is desirable that a voltage difference between the voltage Vcc of the power source terminal 2 and the output voltage Vcrt of the regulator 5 at the time of burn-in be arbitrarily set according to a normal power source voltage of the power source device and the burn-in voltage of the internal circuit 16. In addition, the voltage difference is provided between the voltage Vcc of the power source terminal 2 and the output voltage Vcrt of the regulator 5 at the time of burn-in. Therefore, even when noises are applied to the burn-in terminal 3 and mistakenly cause the burn-in state, the voltage applied to the internal circuit 16 can be suppressed to be equal to or less than the burn-in voltage, so that it is possible to prevent damage of the internal circuit 16.

Next, the operation at the time of standby will be described. At the time of standby, the voltage (burn-in signal) of the burn-in terminal 3 is set to the high level, and the voltage (standby signal) of the standby terminal 4 is also set to the high level. At this time, 6 V is supplied to the voltage Vcc of the power source terminal 2 as a power source voltage at the time of standby. At this time, since the MOS transistor 10 enters the ON state by the burn-in signal, the MOS transistor 9 moves to the ON state, and the MOS transistor 12 moves to the OFF state. As a result, the base and the collector of the transistor 11 are connected by the fixed resistor 8, and the output voltage of the regulator 5 becomes 5.4 V dropped by a voltage (about 0.6 V) corresponding to one diode voltage from Vcc. Therefore, 5.4 V is supplied to the internal circuit 16.

In addition, the regulator 5 and the internal circuit 16 move to a standby state (low power consumption state) by the standby signal. As a result, the consumption current Ibg of the reference voltage source 6 becomes "0", and the consumption current Iamp of the amplifier 7 also becomes "0", and the current Ires flowing to the fixed resistors 13 and 14 also becomes "0". The consumption current Icc of the power source terminal 2 becomes a sum of the consumption current Ibg of the reference voltage source 6, the consumption current Iamp of the amplifier 7, the current Ires flowing to the fixed resistors 13 and 14, and the consumption current Icrt of the internal circuit 16, so that the current of the power source terminal 2 becomes equal to the consumption current (the current of the output terminal of the regulator) of the internal circuit 16. In addition, the consumption current Icrt of the internal circuit 16 becomes "0" if the internal circuit is normal. In a case where the internal circuit 16 is damaged by the burn-in and thus a leak current is increased, a current Ileak flows. Therefore, the current Icc of the power source terminal 2 becomes "0" if the internal circuit 16 is normal. In a case where the internal circuit 16 is damaged by the burn-in and thus the leak current is increased, the current Ileak flows. In other words, a standby current (an increased leak current) of the internal circuit 16 can be detected by measuring the current Icc of the power source terminal 2.

In general, in order to measure the standby current of the internal circuit 16, the regulator 5 is separated from the internal circuit 16, a power source is individually connected to the internal circuit 16 to measure the current, and the regulator 5 and the internal circuit 16 need to be connected after the measurement. However, in this embodiment, there is provided the standby terminal to make the consumption current of the regulator 5 set to "0". Therefore, the standby current of the internal circuit 16 can be detected only by measuring the current Icc of the power source terminal 2.

In addition, in this embodiment, the output voltage of the regulator is changed according to the voltage Vcc of the power source terminal 2 as illustrated in FIG. 3, so that the power source voltage of the internal circuit 16 can be arbitrarily changed. Therefore, it is possible to apply a power source voltage optimized for measuring the standby current of the internal circuit 16 to the internal circuit 16. In other words, when a high power source voltage is applied to the internal circuit 16 in order to measure the standby current of the internal circuit 16, it is possible to detect an increase of a leak current caused by a smaller failure.

In addition, since there is provided the burn-in terminal 3 in this embodiment to cause the output voltage of the regulator 5 to be changed according to the voltage of the power source terminal 2, the burn-in voltage (4.4 V) can be applied to the internal circuit 16 only by setting the voltage of the burn-in terminal 3 to the high level, and the facility for performing the burn-in can be simplified.

In addition, in this embodiment, the current flowing to the reference voltage source 6, the amplifier 7, and the resistors 14 and 15 is blocked at the time of measuring the standby current, and at the same time the MOS transistor 10 is set to the ON state by the burn-in signal so that the MOS transistor 9 is set to the ON state and the MOS transistor 12 is set to the OFF state. Therefore, the current of the power source terminal 2 is set to be equal to the current of the output terminal of the regulator 5. As a result, since the standby current of the internal circuit 16 can be measured from the current of the power source terminal 2, the standby current of the internal circuit 16 can be easily measured without separating the power source line from the internal circuit 16.

Second Embodiment

Figure 5:
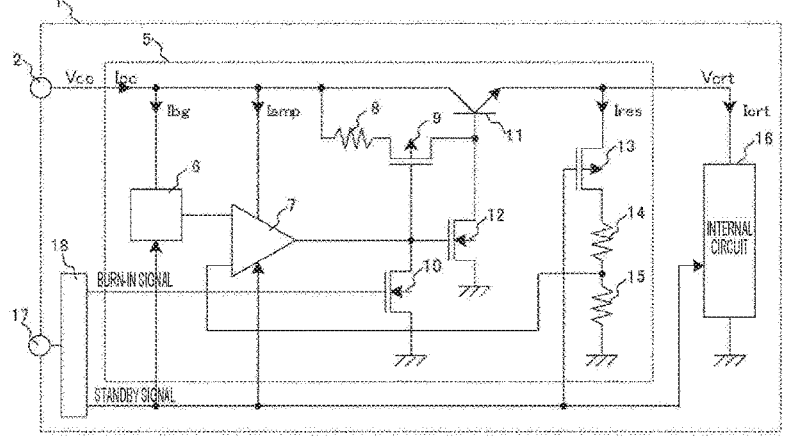
FIG. 5 is a diagram illustrating a configuration of an electronic device of a second embodiment.
Figure 6:
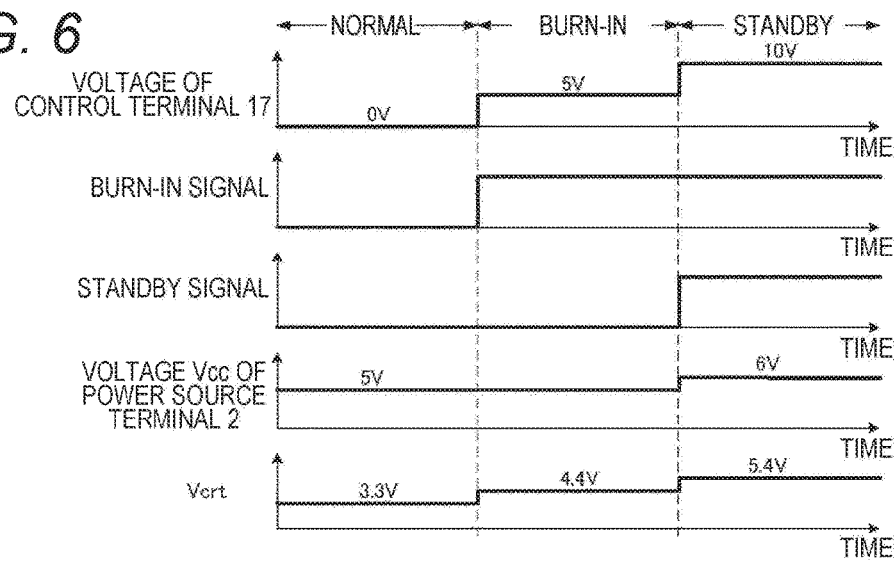
FIG. 6 is an operation chart of the electronic device of the second embodiment.

Next, an electronic device of a second embodiment of the invention will be described using FIGS. 5 and 6. Further, FIG. 5 is a diagram illustrating a configuration of the electronic device of the second embodiment, and FIG. 6 is an operation chart of the electronic device of the second embodiment.

The electronic device of the second embodiment basically has the same configuration as that of the electronic device of the first embodiment, and the number of terminals is reduced by adding a control terminal 17 and a three-level logic circuit 18 while the burn-in terminal 3 and the standby terminal 4 are eliminated.

Next, an operation of the electronic device 1 of this embodiment will be described using FIG. 6. At a normal time, the voltage of the control terminal 17 is set to 0 V, and 5 V is supplied to the voltage Vcc of the power source terminal 2 as the power source voltage at a normal time. At this time, the burn-in signal is output at the low level by the three-level logic circuit 18, and the standby signal is also output at the low level. As a result, since the regulator 5 is operated normally, the output voltage Vcrt of the regulator 5 is output 3.3V, and the internal circuit 16 is also operated normally by Vcrt.

Next, the operation at the time of burn-in will be described. At the time of burn-in, the voltage of the control terminal 17 is set to 5 V, and 5 V is supplied to the voltage Vcc of the power source terminal 2 as the power source voltage at a normal time. At this time, the burn-in signal is output at the high level by the three-level logic circuit 18, and the standby signal is output at the low level. As a result, the output voltage of the regulator 5 becomes 4.4 V dropped by about 0.6 V from Vcc, and a burn-in voltage of 4.4 V is supplied to the internal circuit 16.

Next, the operation at the time of standby will be described. At the time of standby, the voltage of the control terminal 17 is set to 10 V, and 6 V is supplied to the voltage Vcc of the power source terminal 2 as the power source voltage at the time of standby. At this time, the burn-in signal by the three-level logic circuit 18 is output at the high level, and the standby signal is also output at the high level. As a result, the output voltage of the regulator 5 becomes 5.4 V dropped by about 0.6 V from Vcc, and a voltage of 5.4 V for measuring the standby current is supplied to the internal circuit 16 and also the regulator 5 and the internal circuit 16 is set to the standby state, so that the standby current of the internal circuit 16 can be measured from the current of the power source terminal 2.

In this embodiment, the number of terminals can be reduced by adding the three-level logic circuit 18. In addition, a malfunction caused by the noises can be reduced by setting a threshold of the three-level logic circuit 18 to be a high voltage.

Third Embodiment

Figure 7:
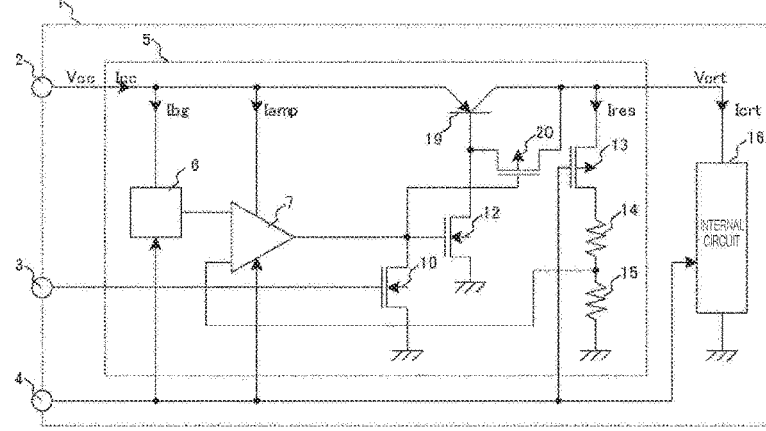
FIG. 7 is a diagram illustrating a configuration of an electronic device of a third embodiment.

Next, an electronic device of a third embodiment of the invention will be described using FIG. 7. Further, FIG. 7 is a diagram illustrating a configuration of the electronic device of the third embodiment.

The electronic device of the third embodiment is a modification basically having the same configuration as that of the electronic device of the first embodiment except that the (NPN-type) transistor 11 is changed into a PNP-type transistor 19. In the electronic device of the third embodiment, since the PNP-type transistor 19 is configured, a MOS transistor 20 is added while the fixed resistor 8 and the MOS transistor 9 are eliminated. Therefore, since the MOS transistor 10 enters the ON state by the burn-in signal, the MOS transistor 12 moves to the OFF state, and the MOS transistor 20 moves to the ON state. As a result, the base and the collector of the transistor 19 are connected, the output voltage of the regulator 5 becomes 4.4 V dropped by about 0.6 V from Vcc, and 4.4 V is supplied to the internal circuit 16. In addition, since the MOS transistor 12 enters the OFF state in the standby state (the burn-in terminal and the standby terminal are at the high level), the current flowing from the base terminal of the transistor 19 to the ground is blocked. Therefore, the current Icc of the power source terminal 2 and the current of the internal circuit 16 become equal, so that the standby current of the internal circuit 16 can be measured by measuring the current of the power source terminal 2.

Fourth Embodiment

Figure 8:
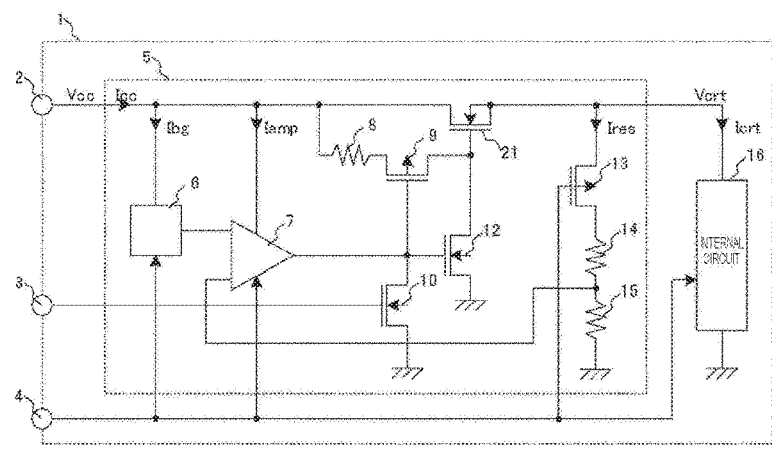
FIG. 8 is a diagram illustrating a configuration of an electronic device of a fourth embodiment.

Next, an electronic device of a fourth embodiment of the invention will be described using FIG. 8. Further, FIG. 8 is a diagram illustrating a configuration of the electronic device of the fourth embodiment.

The electronic device of the fourth embodiment is a modification basically having the same configuration as that of the electronic device of the first embodiment except that the (NPN-type) transistor 11 is changed into an N-type MOS transistor 21. Even in this embodiment, the MOS transistor 10 enters the ON state by the burn-in signal, and the MOS transistor 12 moves to the OFF state and the MOS transistor 20 moves to the ON state. As a result, the gate and the drain of the MOS transistor 21 are connected, and the output voltage of the regulator 5 becomes 4.4 V dropped by a threshold (about 0.6 V) of the MOS transistor 21 from Vcc. Therefore, 4.4 V is supplied to the internal circuit 16. In addition, since the MOS transistor 12 enters the OFF state in the standby state (the burn-in terminal and the standby terminal are at the high level), the current flowing from the MOS transistor 9 to the ground is blocked. Therefore, the current Icc of the power source terminal 2 and the current of the internal circuit 16 become equal, so that the standby current of the internal circuit 16 can be measured by measuring the current of the power source terminal 2.

Fifth Embodiment

Figure 9:
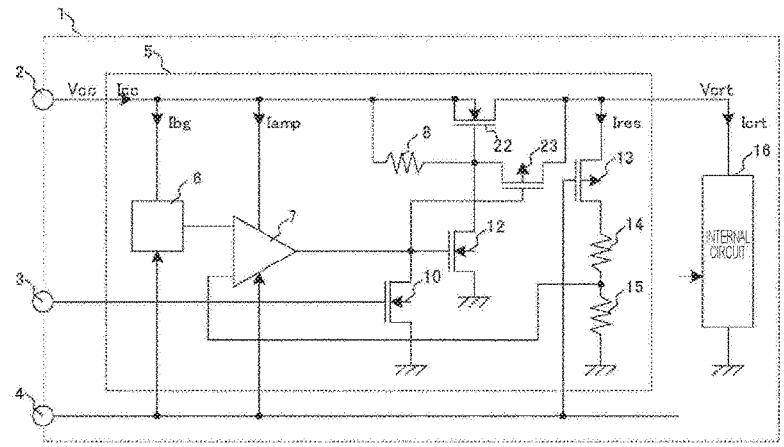
FIG. 9 is a diagram illustrating a configuration of an electronic device of a fifth embodiment.

Next, an electronic device of a fifth embodiment of the invention will be described using FIG. 9. Further, FIG. 9 is a diagram illustrating a configuration of the electronic device of the fifth embodiment.

The electronic device of the fifth embodiment is a modification basically having the same configuration as that of the electronic device of the first embodiment except that the (NPN-type) transistor 11 is changed into a P-type MOS transistor 22. Since the electronic device of the fifth embodiment is changed into the P-type MOS transistor 22, a MOS transistor 23 is added while the MOS transistor 9 is eliminated. Even in this embodiment, the MOS transistor 10 enters the ON state by the burn-in signal, and the MOS transistor 12 moves to the OFF state and the MOS transistor 23 moves to the ON state. As a result, the gate and the drain of the MOS transistor 22 are connected, and the output voltage of the regulator 5 becomes 4.4 V dropped by a threshold (about 0.6V) of the MOS transistor 22 from Vcc. Therefore, 4.4 V is supplied to the internal circuit 16. In addition, since the MOS transistor 12 enters the OFF state in the standby state (the burn-in terminal and the standby terminal are at the high level), the current flowing from the resistor 8 to the ground is blocked. Therefore, the current Icc of the power source terminal 2 and the current of the internal circuit 16 become equal, so that the standby current of the internal circuit 16 can be measured by measuring the current of the power source terminal 2.

Sixth Embodiment

Figure 10:
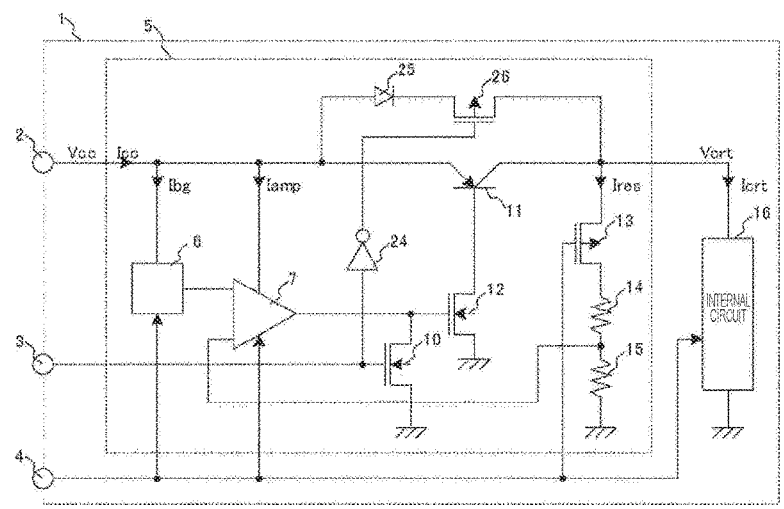
FIG. 10 is a diagram illustrating a configuration of an electronic device of a sixth embodiment.

Next, an electronic device of a sixth embodiment of the invention will be described using FIG. 10. Further, FIG. 10 is a diagram illustrating a configuration of the electronic device of the sixth embodiment.

The electronic device of the sixth embodiment is a modification basically having the same configuration as that of the electronic device of the first embodiment except that the resistor 8 and the MOS transistor 9 are eliminated, and an inverter 24, a diode 25, and a MOS transistor 26 are added. In the electronic device of the sixth embodiment, the transistor 10 is set to the ON state by the burn-in signal, the MOS transistor 12 moves to the OFF state, the transistor 11 is set to the OFF state to block the current of the transistor 11, and the burn-in signal is applied to the gate of the MOS transistor 26 through the inverter 24, so that the MOS transistor 26 is set to the ON state. Therefore, the power source terminal 2 is connected to the internal circuit 16 through the diode 25. As a result, the output voltage of the regulator 5 becomes 4.4 V dropped by a voltage (about 0.6 V) of a diode 25 from the voltage Vcc of the power source terminal 2. Therefore, 4.4 V is supplied to the internal circuit 16. In addition, since the transistor 11 enters the OFF state in the standby state (the burn-in terminal and the standby terminal are at the high level), the current Icc of the power source terminal 2 and the current of the internal circuit 16 become equal. In other words, the standby current of the internal circuit 16 can be measured by measuring the current of the power source terminal 2. Since the number of connections of the diode 25 is changed in this embodiment, a voltage difference between the voltage of the power source terminal 2 and the voltage of the internal circuit 16 at the time of burn-in is easily changed. As a result, versatility can be improved with respect to a variation of the voltage of the power source terminal 2 and the burn-in voltage of the internal circuit 16.

Seventh Embodiment

Figure 11:
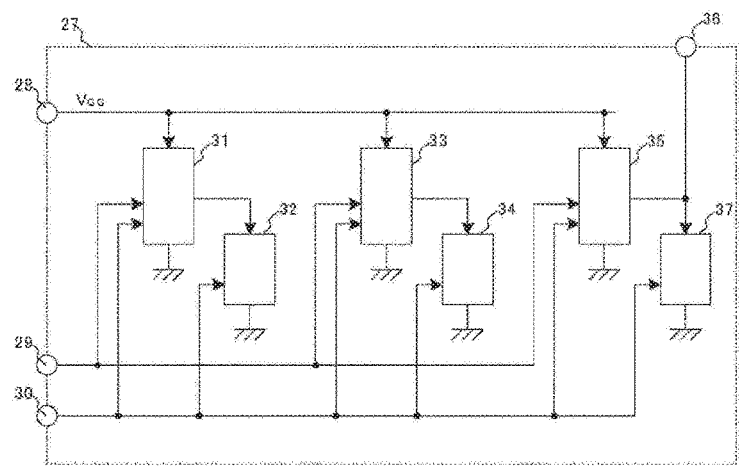
FIG. 11 is a diagram illustrating a configuration of an electronic device of a seventh embodiment.

Next, an electronic device of a seventh embodiment of the invention will be described using FIG. 11. Further, FIG. 11 is a diagram illustrating a configuration of the electronic device of the seventh embodiment.

An electronic device 27 of the seventh embodiment is configured by a power source terminal 28 which supplies power, a burn-in terminal 29 which applies the burn-in signal, a standby terminal 30 which applies the standby signal, a regulator 31 which generates a predetermined voltage from the voltage of the power source terminal 28, an internal circuit 32 which is operated by an output voltage of the regulator 31, a regulator 33 which generates a predetermined voltage from the voltage of the power source terminal 28, an internal circuit 34 which is operated by an output voltage of the regulator 33, a regulator 35 which generates a predetermined voltage from the voltage of the power source terminal 28, an internal circuit 37 which is operated by an output voltage of the regulator 35, and an observation terminal 36 through which the output voltage of the regulator 35 is observed, all of which are integrated into one integrated circuit.

The operations of the respective regulators 31, 33, and 35 and the internal circuits 32, 34, and 37 of this embodiment are the same as those of the first embodiment, and the internal circuits 32, 34, and 37 are added to three regulators 31, 33, and 35 respectively. In the integrated circuit, a plurality of regulators may be provided according to the configuration of the internal circuit. Even in this case, the burn-in of the internal circuits 32, 34, and 37 can be easily performed using the burn-in terminal 29 and the standby terminal 30 as illustrated in the first embodiment, and the measurement of the standby currents of the internal circuits 32, 34, and 37 can be realized by measuring the current of the power source terminal 28. Further, the observation terminal 36 is provided to confirm the internal voltage in this embodiment so as to confirm the output voltage of the regulator 35.

REFERENCE SIGNS LIST 1 electronic device
2 power source terminal
3 burn-in terminal
4 standby terminal
5 regulator
6 reference voltage source
7 amplifier
8 fixed resistor
9 MOS transistor
10 MOS transistor
11 transistor
12 MOS transistor
13 MOS transistor
14 fixed resistor
15 fixed resistor
16 internal circuit 17 control terminal
18 three-level logic circuit
19 transistor
20 MOS transistor
21 MOS transistor
22 MOS transistor
23 MOS transistor
24 inverter
25 diode
26 MOS transistor
27 electronic device
28 power source terminal
29 burn-in terminal
30 standby terminal
31 regulator
32 internal circuit
33 regulator
34 internal circuit
35 regulator
36 observation terminal
37 internal circuit
104 regulator circuit
105 regulator output line
106 battery power line
500 voltage monitoring circuit
501 amplifier circuit
502 division ratio switching circuit
503 constant voltage generating transistor
510 MOS transistor
511 comparator
512 bandgap reference

The invention claimed is:

1. An electronic device comprising:
a power source terminal;
a regulator that generates a predetermined voltage from a voltage of the power source terminal;
an internal circuit that is operated by an output voltage of the regulator;
a standby terminal through which the regulator and the internal circuit are set to a low power consumption state; and
a burn-in terminal that shifts the output voltage of the regulator to a state that changes according to the voltage of the power supply, wherein
when predetermined voltage is applied to the burn-in terminal, the output voltage of the regulator which is lower than the voltage of the power supply terminal is applied to the internal circuit,
when a predetermined voltage is applied to the standby terminal, the regulator and the internal circuit are brought into a low power consumption state so that the current of the power supply terminal and the current of the output terminal of the regulator are made equal, and
when a predetermined voltage is applied to both the burn-in terminal and the standby terminal, the standby current of the internal circuit can be detected only by measuring the current of the power supply terminal.

2. The electronic device according to claim 1, comprising:
a unit that changes the output voltage of the regulator according to a voltage of the power source terminal.

3. The electronic device according to claim 1, comprising:
a burn-in terminal through which it is caused a state where the output voltage of the regulator is changed according to the voltage of the power source terminal.

4. The electronic device according to claim 1, comprising:
a unit that sets a current of the power source terminal to be equal to a current of an output terminal of the regulator.

5. The electronic device according to claim 3,
wherein the burn-in terminal and the standby terminal are configured from the same terminal, and
the electronic device includes a three-level logic circuit that causes a state where the output voltage of the regulator is changed according to the voltage of the power source terminal, and causes the regulator and the internal circuit move to the low power consumption state according to a voltage level applied to the same terminal.

6. The electronic device according to claim 2,
wherein, when the regulator and the internal circuit are in the low power consumption state, the regulator and the internal circuit enter a state where the output voltage of the regulator is changed according to the voltage of the power source terminal.

7. The electronic device according to claim 2,
wherein, when the output voltage of the regulator is changed according to the voltage of the power source terminal, the output voltage of the regulator is set to be low compared to the voltage of the power source terminal.

8. The electronic device according to claim 1,
wherein an output circuit of the regulator is configured by an NPN-type transistor, and
the electronic device includes a switching element that blocks a current flowing to a ground side of a base terminal of the NPN-type transistor.

9. The electronic device according to claim 1,
wherein an output circuit of the regulator is configured by a PNP-type transistor, and
the electronic device includes a switching element that blocks a current flowing to a ground side of a base terminal of the PNP-type transistor.

10. The electronic device according to claim 2,
wherein an output circuit of the regulator is configured by a MOS-type transistor, and
wherein the MOS-type transistor is turned on in a state where the output voltage of the regulator is changed according to the voltage of the power source terminal.

11. The electronic device according to claim 2, comprising:
a switch that connects the power source terminal and a power source of the internal circuit,
wherein the switch is turned on in a state where the output voltage of the regulator is changed according to the voltage of the power source terminal.

12. The electronic device according to claim 1,
wherein the regulator and the internal circuit are disposed in the same integrated circuit.

13. An electronic device comprising:
a power source terminal;
a regulator that generates a predetermined voltage from a voltage of the power source terminal;
an internal circuit that is operated by an output voltage of the regulator;
a standby terminal through which the regulator and the internal circuit are set to a low power consumption state; and
a burn-in terminal through which it is caused a state where the output voltage of the regulator is changed according to the voltage of the power source terminal, wherein the burn-in terminal and the standby terminal are configured from the same terminal, and the electronic device includes a three-level logic circuit that causes a state where the output voltage of the regulator is changed according to the voltage of the power source terminal, and causes the regulator and the internal circuit move to the low power consumption state according to a voltage level applied to the same terminal.

14. The electronic device according to claim 13, comprising:
a unit that changes the output voltage of the regulator according to a voltage of the power source terminal.

15. The electronic device according to claim 13, comprising:
a unit that sets a current of the power source terminal to be equal to a current of an output terminal of the regulator.

16. The electronic device according to claim 14,
wherein, when the regulator and the internal circuit are in the low power consumption state, the regulator and the internal circuit enter a state where the output voltage of the regulator is changed according to the voltage of the power source terminal.

17. The electronic device according to claim 14,
wherein, when the output voltage of the regulator is changed according to the voltage of the power source terminal, the output voltage of the regulator is set to be low compared to the voltage of the power source terminal.

18. The electronic device according to claim 13,
wherein an output circuit of the regulator is configured by an NPN-type or a PNP-type transistor, and
the electronic device includes a switching element that blocks a current flowing to a ground side of a base terminal of the NPN-type transistor, or of the PNP-type transistor.

19. The electronic device according to claim 14,
wherein an output circuit of the regulator is configured by a MOS-type transistor, and
wherein the MOS-type transistor is turned on in a state where the output voltage of the regulator is changed according to the voltage of the power source terminal.

20. The electronic device according to claim 14, comprising:
a switch that connects the power source terminal and a power source of the internal circuit,
wherein the switch is turned on in a state where the output voltage of the regulator is changed according to the voltage of the power source terminal.

* * * * *